(12) United States Patent
Bae et al.

(10) Patent No.: US 11,114,172 B2
(45) Date of Patent: Sep. 7, 2021

(54) MEMORY SYSTEM AND METHOD OF OPERATING THE SAME

(71) Applicant: SK hynix Inc., Icheon-si (KR)

(72) Inventors: Sung Won Bae, Icheon-si (KR); Dong Jae Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/930,919

(22) Filed: Jul. 16, 2020

(65) Prior Publication Data

US 2021/0241840 A1 Aug. 5, 2021

(30) Foreign Application Priority Data

Feb. 5, 2020 (KR) ........................ 10-2020-0013908

(51) Int. Cl.
*G11C 16/06* (2006.01)
*G11C 16/34* (2006.01)
*G11C 16/10* (2006.01)
*G11C 16/26* (2006.01)
*G11C 16/16* (2006.01)

(52) U.S. Cl.
CPC ........ *G11C 16/3454* (2013.01); *G11C 16/107* (2013.01); *G11C 16/16* (2013.01); *G11C 16/26* (2013.01); *G11C 16/3404* (2013.01)

(58) Field of Classification Search
CPC .................................................. G11C 16/3454
See application file for complete search history.

(56) References Cited

U.S. PATENT DOCUMENTS

2020/0082899 A1* 3/2020 Lee ...................... G11C 16/32

FOREIGN PATENT DOCUMENTS

KR             101327693 B1    11/2013
KR        1020180026876 A      3/2018

* cited by examiner

*Primary Examiner* — Hoai V Ho
(74) *Attorney, Agent, or Firm* — William Park & Associates Ltd.

(57) ABSTRACT

Provided herein may be a memory system and a method of operating the same. The memory system may include a memory device including super blocks, each of the super blocks including a plurality of memory blocks, and a controller configured to control the memory device so that a program operation is performed on a selected memory block within any one of the super blocks based on a request from a host, wherein, when a program fail occurs during the program operation that is performed on the selected memory block of the selected super block, the controller is configured to control the memory device so that a test read operation is performed on remaining memory blocks, besides the selected memory block, of the selected super block.

20 Claims, 9 Drawing Sheets

MEMORY SYSTEM AND METHOD OF OPERATING THE SAME

CROSS-REFERENCE TO RELATED APPLICATION

The present application claims priority under 35 U.S.C. § 119(a) to Korean patent application number 10-2020-0013908, filed on Feb. 5, 2020, in the Korean Intellectual Property Office, the entire disclosure of which is incorporated herein by reference.

BACKGROUND

1. Technical Field

Various embodiments of the present disclosure relate to an electronic device, and more particularly, to a memory system and a method of operating the memory system.

2. Related Art

Recently, the paradigm for a computer environment has been converted into ubiquitous computing, which enables computing systems to be used anywhere and at any time. Due to this, the use of portable electronic devices, such as mobile phones, digital cameras, and notebook computers, has rapidly increased. In general, such portable electronic devices use a memory system that employs a memory device, in other words, a data storage device. The data storage device is used as a main memory device or an auxiliary memory device for portable electronic devices.

A data storage device that utilizes a memory device provides advantages in that, since there is no mechanical driver, stability and durability are excellent, information access speed is very high, and power consumption is low. Data storage devices, as an example of the memory system with such advantages, include a universal serial bus (USB) memory device, memory cards with various interfaces, and a solid state drive (SSD).

Memory devices are chiefly classified into a volatile memory device and a nonvolatile memory device.

A nonvolatile memory device has comparatively low write and read speed, but retains data that is stored therein even when the supply of power is interrupted. Therefore, the nonvolatile memory device is used to store data to be retained regardless of whether power is supplied. Representative examples of the nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. The flash memory is classified into a NOR type and a NAND type.

SUMMARY

An embodiment of the present disclosure may provide for a memory system. The memory system may include a memory device including super blocks, each of the super blocks including a plurality of memory blocks, and a controller configured to control the memory device so that a program operation is performed on a selected memory block within any one of the super blocks based on a request from a host, wherein, when a program fail occurs during the program operation that is performed on the selected memory block of the selected super block, the controller is configured to control the memory device so that a test read operation is performed on remaining memory blocks, besides the selected memory block, of the selected super block.

An embodiment of the present disclosure may provide for a memory system. The memory system may include a memory device including a plurality of memory blocks and a controller configured to control the memory device so that a program operation is performed on a first memory block, among the plurality of memory blocks, based on a request from a host, wherein, when a program fail occurs during the program operation that is performed on the first memory block, the controller is configured to control the memory device so that a test read operation is performed on second memory blocks in a same super block as the first memory block and configured to control the memory device so that a data shift operation is performed on the second memory blocks based on a result of the test read operation.

An embodiment of the present disclosure may provide for a method of operating a memory system. The method may include performing a program operation on a memory block that is selected from among a plurality of memory blocks, when a program fail occurs in the selected memory block, performing a test read operation on remaining memory blocks, besides the selected memory block, included in a same super block as the selected memory block, and performing a data shift operation on memory blocks, among the remaining memory blocks, in which a read fail has occurred as a result of the test read operation.

DETAILED DESCRIPTION

Various embodiments of the present disclosure will now be described more fully hereinafter with reference to the accompanying drawings, in which preferred embodiments of the present disclosure are shown, so that those skilled in the art can easily practice the technical spirit of the present disclosure.

Various embodiments of the present disclosure are directed to a memory system that is capable of suppressing the possibility of errors occurring in memory blocks included in a memory device, and a method of operating the memory system.

Figure 1:
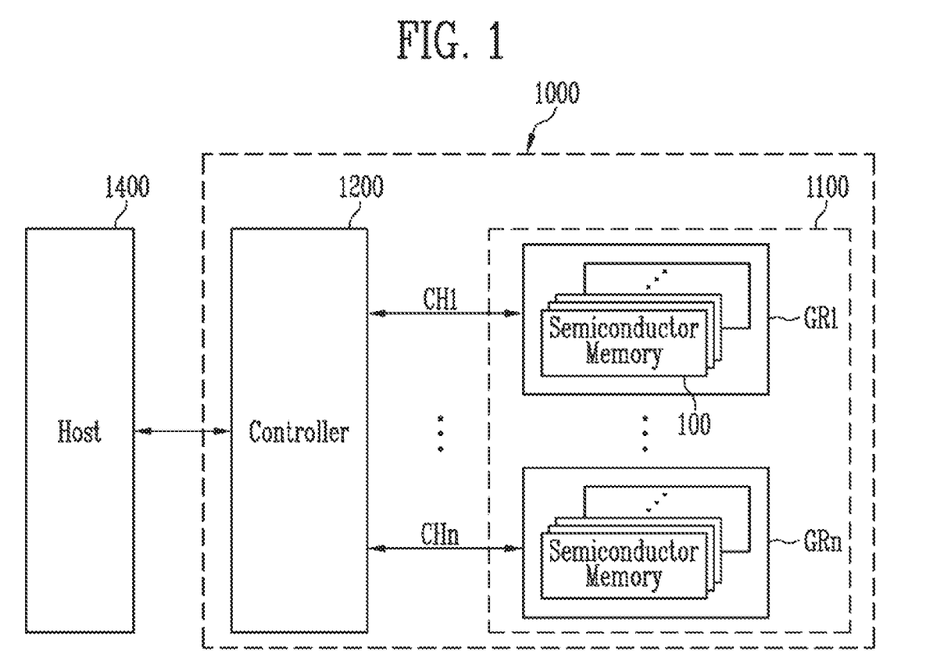
FIG. 1 is a block diagram, illustrating a memory system, according to an embodiment of the present disclosure.

FIG. 1 is a block diagram, illustrating a memory system, according to an embodiment of the present disclosure.

Referring to FIG. 1, a memory system 1000 may include a memory device 1100 and a controller 1200. The memory device 1100 may include a plurality of semiconductor memories 100. The plurality of semiconductor memories 100 may be divided into a plurality of groups GR1 to GRn. Further, the memory system 1000 may divide a plurality of memory blocks that are included in the plurality of semiconductor memories 100 into a plurality of super blocks, each including at least one memory block. The above-described super blocks will be described later with reference to FIG. 6.

In FIG. 1, it is illustrated that the plurality of groups GR1 to GRn individually communicate with the controller 1200 through first to n-th channels CH1 to CHn. Each semiconductor memory 100 will be described later with reference to FIG. 3.

The groups GR1 to GRn may individually communicate with the controller 1200 through one common channel. The controller 1200 may control the plurality of semiconductor memories 100 of the memory device 1100 through the plurality of channels CH1 to CHn.

The controller 1200 is coupled between a host 1400 and the memory device 1100. The controller 1200 may access the memory device 1100 based on a request from the host 1400. For example, the controller 1200 may control read, write, erase, and background operations of the memory device 1100 based on requests that are received from the host 1400. The controller 1200 may provide an interface between the memory device 1100 and the host 1400. The controller 1200 may run firmware to control the memory device 1100. Also, when a fail occurs during a program operation or a read operation that is performed on a memory block in the super block within the memory device 1100 based on a request from the host 1400, the controller 1200 may control the memory device 1100 so that a test read operation is performed on an additional memory block that is included in the super block. The controller 1200 may determine that, for a memory block in which a read fail has been detected as a result of the test read operation, an error may latently occur in the memory block. The controller may then control the corresponding memory block to perform a data shift operation to shift and store valid data, stored in the memory block, to and in an additional memory block.

The above-described memory system 1000 may be designed to additionally include a buffer memory.

The host 1400 may control the memory system 1000. The host 1400 may include portable electronic devices, such as a computer, a personal digital assistant (PDA), a portable multimedia player (PMP), an MP3 player, a camera, a camcorder, and a mobile phone. The host 1400 may request the write operation, the read operation, or the erase operation of the memory system 1000 through a command.

The controller 1200 and the memory device 1100 may be integrated into a single semiconductor device. In an exemplary embodiment, the controller 1200 and the memory device 1100 may be integrated into a single semiconductor device to form a memory card. For example, the controller 1200 and the memory device 1100 may be integrated into a single semiconductor device to form a memory card such as a PC card (e.g., personal computer memory card international association: PCMCIA), a compact flash card (CF), a smart media card (SM or SMC), a memory stick, a multi-media card (MMC, RS-MMC, or MMCmicro), an SD card (SD, miniSD, microSD, or SDHC), or a universal flash storage (UFS).

The controller 1200 and the memory device 1100 may be integrated into a single semiconductor device to form a solid state drive (SSD). The SSD includes a storage device configured to store data in a semiconductor memory. When the memory system 1000 is used as the SSD, an operation speed of the host 1400, coupled to the memory system 1000, may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an exemplary embodiment, the memory device 1100 or the memory system 1000 may be mounted as various types of packages. For example, the memory device 1100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

Figure 2:
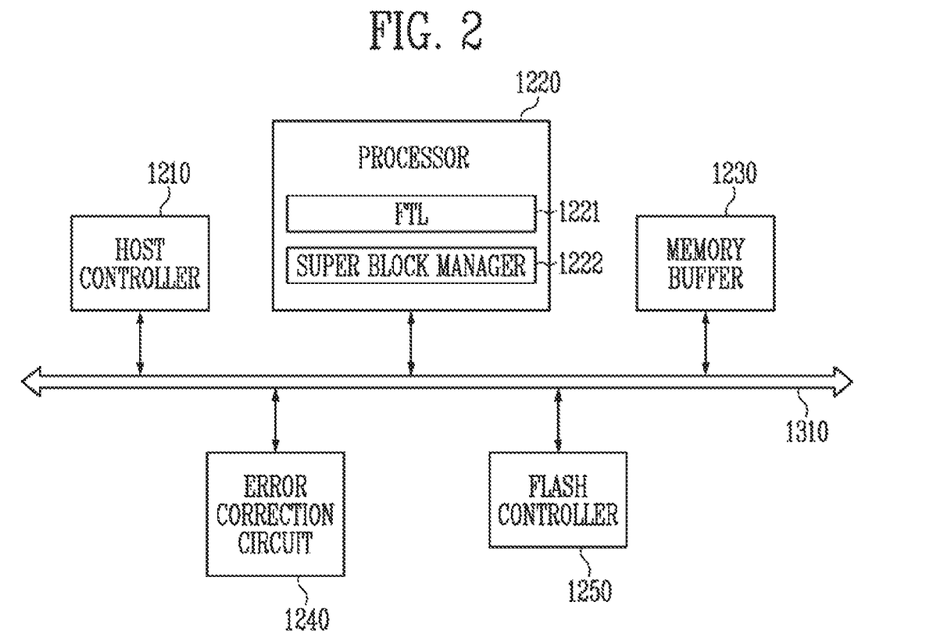
FIG. 2 is a block diagram, illustrating the configuration of a controller of FIG. 1.

FIG. 2 is a block diagram, illustrating the configuration of the controller of FIG. 1.

Referring to FIG. 2, the controller 1200 may include a host controller 1210, a processor 1220, a memory buffer 1230, an error correction circuit 1240, a flash controller 1250, and a bus 1310.

The bus 1310 may provide a channel between components of the controller 1200.

The host controller 1210 may control the transmission of data between the host 1400 of FIG. 1 and the memory buffer 1230. In an example, the host controller 1210 may control an operation of buffering data, input from the host 1400, in the memory buffer 1230. In an example, the host controller 1210 may control an operation of outputting data, buffered in the memory buffer 1230, to the host 1400. The host controller 1210 may include a host interface.

The processor 1220 may control the overall operation of the controller 1200 and perform a logical operation. The processor 1220 may communicate with the host 1400 of FIG. 1 through the host controller 1210 and may communicate with the memory device 1100 of FIG. 1 through the flash controller 1250. The processor 1220 may realign a plurality of host commands that are received from the host 1400 of FIG. 1 according to the priority, and the processor 1220 may then generate a command queue to control the flash controller 1250. Also, the processor 1220 may control the memory buffer 1230. The processor 1220 may control the operation of the memory system by using the memory buffer 1230 as a working memory, a cache memory, or a buffer memory.

The processor 1220 may include a flash translation layer (FTL) 1221 and a super block manager 1222.

The flash translation layer (FTL) 1221 may run firmware. The firmware may be stored either in an additional memory (not illustrated), which is directly coupled to the buffer memory 1230 or the processor 1220, or in a storage space in the processor 1220. Also, the FTL 1221 may map a physical address, corresponding to an address (e.g., a logical address) that is input from the host 1400, to the logical address during a write operation. Further, the FTL 1221 may check the physical address that is mapped to the logical address that is input from the host 1400 during a read operation.

Furthermore, the FTL 1221 may generate a command queue to control the flash controller 1250 based on a host command that is received from the host 1400.

When a fail occurs during a program operation or a read operation that is performed on a first memory block, among a plurality of memory blocks that are included in the memory device 1100, the FTL 1221 may control the memory device 1100 so that a test read operation may be performed on second memory blocks that are included in the same super block as the first memory block in which the fail has occurred. Also, the FTL 1221 may control the memory device 1100 so that a data shift operation is performed on third memory blocks, among the second memory blocks, in which a read fail has occurred as a result of the test read operation. The test read operation may be performed on all pages of the second memory blocks or on the same page as that of the first memory block in which a fail has occurred, among the pages of the second memory blocks. For example, when a program operation fail or a read operation fail occurs in an n-th page of the first memory block, the test read operation may be performed on n-th pages of the second memory blocks.

The super block manager 1222 may divide the memory blocks of the plurality of semiconductor memories 100 within the memory device 1100 of FIG. 1 into a plurality of super blocks, each having at least one memory block, and the super block manager 1222 may then manage the super blocks. When a data shift operation is performed on a memory block within a single super block, the super block manager 1222 may manage the super block so that a new memory block in which the shifted data is to be stored is included in the super block.

The memory buffer 1230 may be used as a working memory, a cache memory, or a buffer memory of the processor 1220. The memory buffer 1230 may store codes and commands that are executed by the processor 1220. The memory buffer 1230 may store data that is processed by the processor 1220. The memory buffer 1230 may include a static RAM (SRAM) or a dynamic RAM (DRAM). The memory buffer 1230 may store the command queue that is generated by the processor 1220.

The error correction circuit 1240 may perform an error correction. The error correction circuit 1240 may encode an error correction code (ECC) based on data to be written to the memory device 1100 of FIG. 1 through the flash controller 1250. The ECC-encoded data may be transferred to the memory device 1100 through the flash controller 1250. The error correction circuit 1240 may decode an ECC on data that is received from the memory device 1100 through the flash controller 1250. In an embodiment, the error correction circuit 1240 may be a component within the flash controller 1250. Also, during the test read operation, the error correction circuit 1240 may determine the result of the test read operation based on pieces of read data. For example, when the number of error bits that are contained in the read data is greater than the maximum allowable number of error bits, the error correction circuit 1240 may determine that the result of the test read operation is a fail. On the other hand, when the number of error bits is less than or equal to the maximum allowable number of error bits, the error correction circuit 1240 may determine that the result of the test read operation is a pass.

The flash controller 1250 may generate and output an internal command to control the memory device 1100 based on the command queue that is generated by the processor 1220. The flash controller 1250 may control a program operation by transmitting data, buffered in the memory buffer 1230, to the memory device 1100 during a data write operation. In an example, the flash controller 1250 may control an operation of buffering the data, read and output from the memory device 1100, in the memory buffer 1230 based on the command queue during a read operation. The flash controller 1250 may include a flash interface.

Further, the flash controller 1250 may control the memory device 1100 so that a test read operation on selected memory blocks is performed based on the processor 1220, and the flash controller 1250 may transmit read data that is received from the memory device 1100 to the error correction circuit 1240 during the test read operation.

Furthermore, the flash controller 1250 may control the memory device 1100 so that a data shift operation is performed on selected memory blocks based on the processor 1220. Also, the flash controller 1250 may store the read data, received from the selected memory blocks, in the memory buffer 1230 during the data shift operation. The flash controller 1250 may thereafter transmit the data, stored in the memory buffer 1230, to a new memory block in an erased state.

Figure 3:
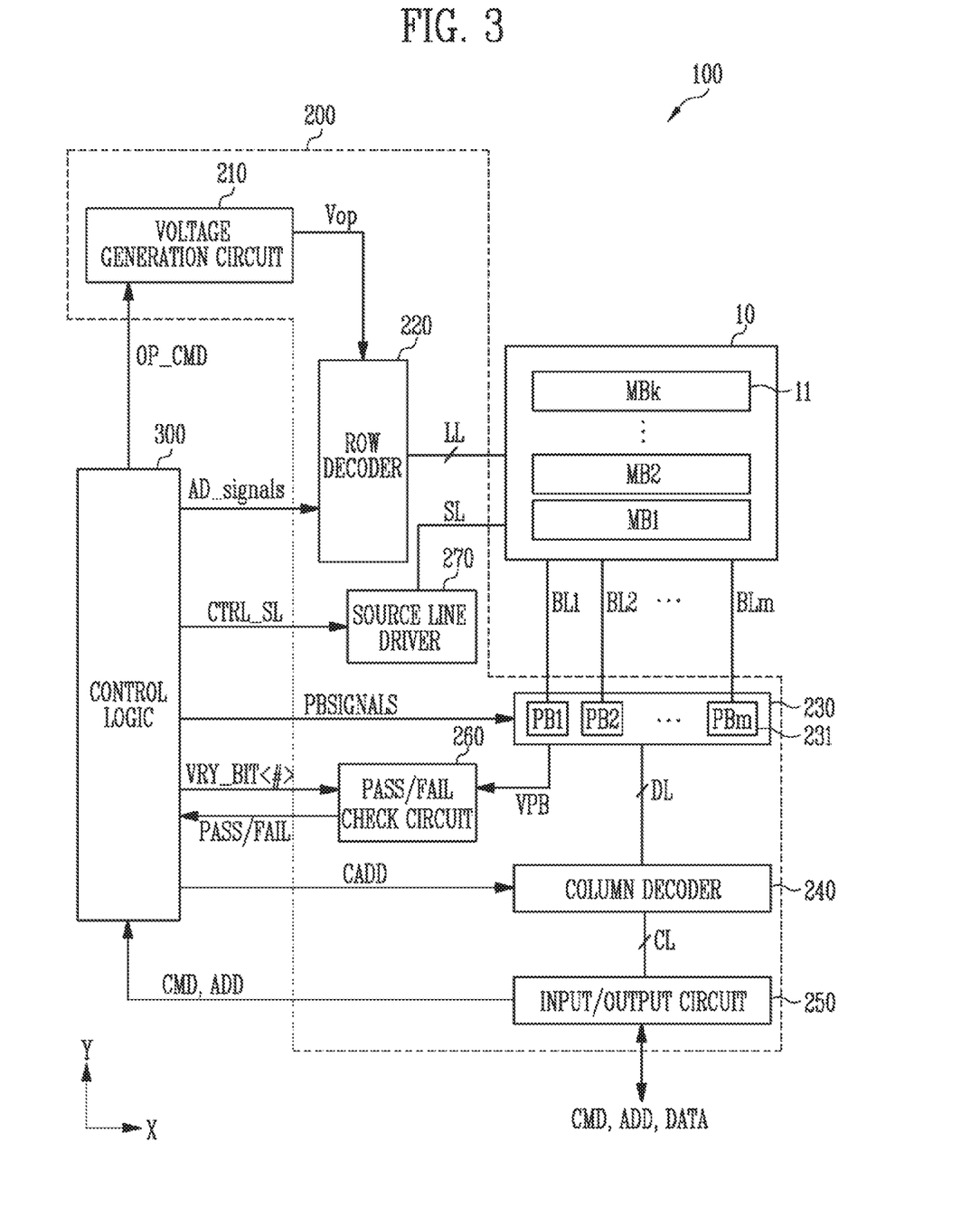
FIG. 3 is a diagram, illustrating a semiconductor memory of FIG. 1.

FIG. 3 is a diagram, illustrating the semiconductor memory 100 of FIG. 1.

Referring to FIG. 3, the semiconductor memory 100 may include a memory cell array 10 in which data is stored. The semiconductor memory 100 may include peripheral circuits 200 that are configured to perform a program operation to store data in the memory cell array 10, a read operation to output the stored data, and an erase operation to erase the stored data. The semiconductor memory 100 may include a control logic 300 that controls the peripheral circuits 200 based on a controller (e.g., 1200 of FIG. 1).

The memory cell array 10 may include a plurality of memory blocks MB1 to MBk 11 (k is a positive integer). Local lines LL and bit lines BL1 to BLm (where m is a positive integer) may be coupled to each of the memory blocks MB1 to MBk 11. For example, the local lines LL may include a first select line, a second select line, and a plurality of word lines arranged between the first and second select lines. Also, the local lines LL may include dummy lines that are arranged between the first select line and the word lines and arranged between the second select line and the word lines. Here, the first select line may be a source select line, and the second select line may be a drain select line. For example, the local lines LL may include the word lines, the drain and source select lines, and source lines SL. For example, the local lines LL may further include dummy lines. For example, the local lines LL may further include pipelines. The local lines LL may be coupled to each of the memory blocks MB1 to MBk 11, and the bit lines BL1 to BLm may be coupled in common to the memory blocks MB1 to MBk 11. The memory blocks MB1 to MBk 11 may each be implemented in a two-dimensional (2D) or a three-dimensional (3D) structure. For example, memory cells in the memory blocks 11 with a 2D structure may be horizontally arranged on a substrate. For example, memory cells in the memory blocks 11 with a 3D structure may be vertically stacked on the substrate.

The peripheral circuits 200 may perform program, read, and erase operations on a selected memory block 11 based on the control logic 300. For example, the peripheral circuits 200 may include a voltage generation circuit 210, a row decoder 220, a page buffer group 230, a column decoder 240, an input/output circuit 250, a pass/fail check circuit 260, and a source line driver 270.

The voltage generation circuit 210 may generate various operating voltages Vop that are used for program, read, and erase operations based on an operation signal OP_CMD. Further, the voltage generation circuit 210 may selectively discharge the local lines LL based on the operation signal OP_CMD. For example, the voltage generation circuit 210 may generate various voltages, such as a program voltage, a verify voltage, a pass voltage, and a select transistor operating voltage based on the control logic 300.

The row decoder 220 may transfer the operating voltages Vop to the local lines LL coupled to the selected memory block 11 based on row decoder control signals AD_signals. For example, the row decoder 220 may selectively apply the operating voltages (e.g., program voltage, verify voltage, pass voltage, etc.), generated by the voltage generation circuit 210, to the word lines of the local lines LL based on the row decoder control signals AD_signals.

The row decoder 220 may apply the program voltage, generated by the voltage generation circuit 210, to a selected word line of the local lines LL based on the row decoder control signals AD_signals during a program voltage application operation. The row decoder 220 may apply the pass voltage, generated by the voltage generation circuit 210, to the remaining word lines, that is, the unselected word lines. Also, the row decoder 220 may apply the read voltage, generated by the voltage generation circuit 210, to a selected word line of the local lines LL based on the row decoder control signals AD_signals during a read operation. The row decoder 220 may apply the pass voltage, generated by the voltage generation circuit 210, to the remaining word lines, that is, the unselected word lines.

The page buffer group 230 may include a plurality of page buffers PB1 to PBm 231 that are coupled to the bit lines BL1 to BLm. The page buffers PB1 to PBm 231 may be operated based on the page buffer control signals PBSIGNALS. For example, the page buffers PB1 to PBm 231 may temporarily store data to be programmed during a program operation or may sense voltages or currents of the bit lines BL1 to BLm during a read or verify operation.

The column decoder 240 may transfer data between the input/output circuit 250 and the page buffer group 230 based on a column address CADD. For example, the column decoder 240 may exchange data with the page buffers 231 through data lines DL or may exchange data with the input/output circuit 250 through column lines CL.

The input/output circuit 250 may transmit an internal command CMD and an address ADD, received from a controller (e.g., 1200 of FIG. 1), to the control logic 300, or the input/output circuit 250 may exchange data DATA with the column decoder 240.

During a read operation or a verify operation, the pass/fail check circuit 260 may generate a reference current based on an enable bit VRY_BIT<#>, compare a sensing voltage VPB that is received from the page buffer group 230 with a reference voltage generated using the reference current, and then output a pass signal PASS or a fail signal FAIL.

The source line driver 270 may be coupled to memory cells that are included in the memory cell array 10 through a source line SL and may control a voltage to be applied to the source line SL. The source line driver 270 may receive a source line control signal CTRL_SL from the control logic 300 and may control the source line voltage to be applied to the source line SL based on the source line control signal CTRL_SL.

The control logic 300 may control the peripheral circuits 200 by outputting the operation signal OP_CMD, the row decoder control signals AD_signals, the page buffer control signals PBSIGNALS, and the enable bit VRY_BIT<#> based on the internal command CMD and the address ADD. In addition, the control logic 300 may determine whether a verify operation has passed or failed based on the pass or fail signal PASS or FAIL.

Figure 4:
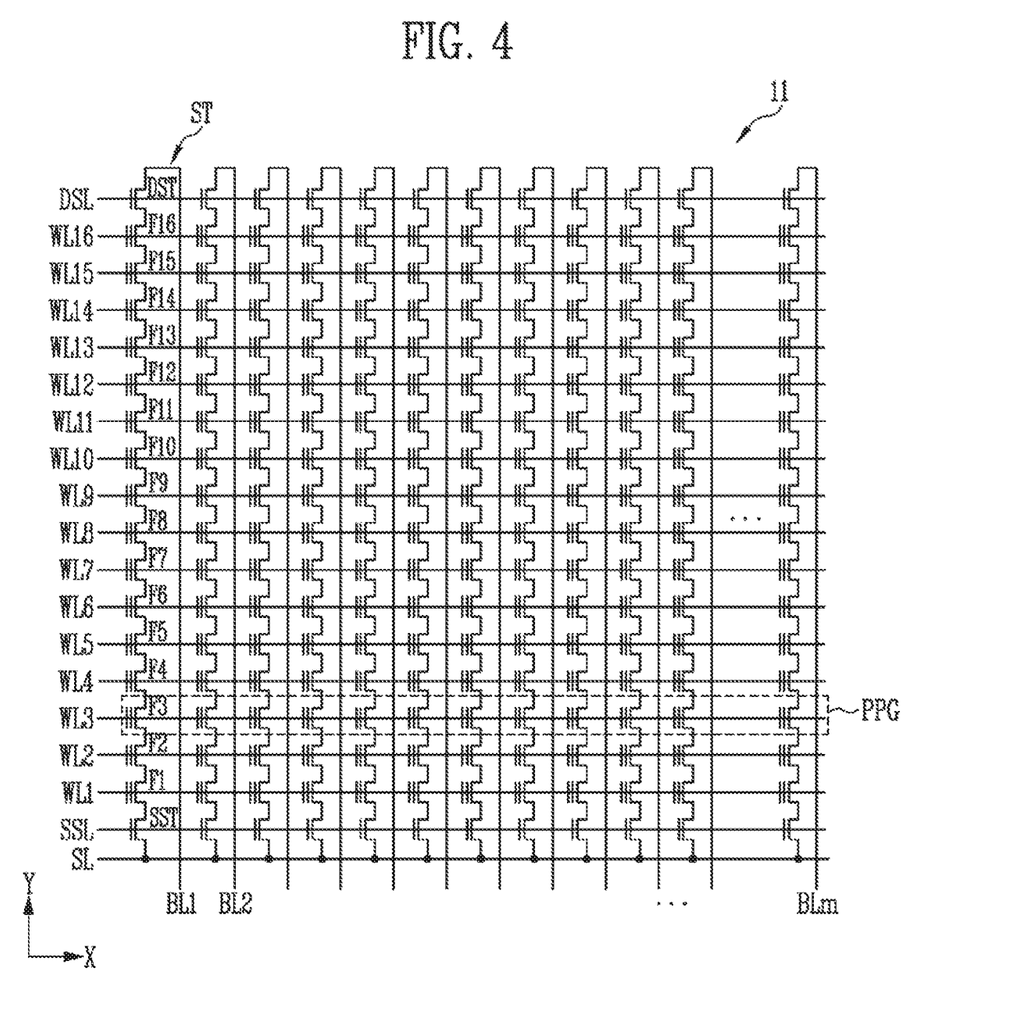
FIG. 4 is a diagram, illustrating a memory block of FIG. 3.

FIG. 4 is a diagram, illustrating the memory block of FIG. 3.

Referring to FIG. 4, the memory block 11 may be configured such that a plurality of word lines, which are arranged in parallel, are coupled between a first select line and a second select line. Here, the first select line may be a source select line SSL and the second select line may be a drain select line DSL. In detail, the memory block 11 may include a plurality of strings ST that are coupled between bit lines BL1 to BLm and a source line SL. The bit lines BL1 to BLm may be respectively coupled to the strings ST, and the source line SL may be coupled in common to the strings ST. Since the strings ST may have the same configuration, a string ST that is coupled to the first bit line BL1 will be described in detail by way of an example below.

The string ST may include a source select transistor SST, a plurality of memory cells F1 to F16, and a drain select transistor DST, which are connected in series between the source line SL and the first bit line BL1. One string ST may include one or more source select transistors SST and drain select transistors DST, and may include more memory cells than the memory cells F1 to F16 illustrated in the drawing.

A source of the source select transistor SST may be coupled to the source line SL, and a drain of the drain select transistor DST may be coupled to the first bit line BL1. The memory cells F1 to F16 may be connected, in series, between the source select transistor SST and the drain select transistor DST. Gates of the source select transistors SST within different strings ST may be coupled to a source select line SSL, gates of the drain select transistors DST may be coupled to a drain select line DSL, and gates of the memory cells F1 to F16 may be coupled to a plurality of word lines WL1 to WL16. A group of memory cells that are coupled to the same word line, among the memory cells included in different strings ST, may be referred to as a "physical page PPG." Therefore, the number of physical pages PPG that are identical to the number of word lines WL1 to WL16 may be included in the memory block 11.

One memory cell may store one bit of data. This is typically referred to as a "single-level cell (SLC)." In this case, one physical page PPG may store data that corresponds to one logical page LPG. The data that corresponds to one logical page LPG may include a number of data bits that are identical to the number of cells that are included in one physical page PPG. Further, one memory cell may store two or more bits of data. This cell is typically referred to as a "multi-level cell (MLC)". Here, one physical page PPG may store data that corresponds to two or more logical pages LPG.

Figure 5:
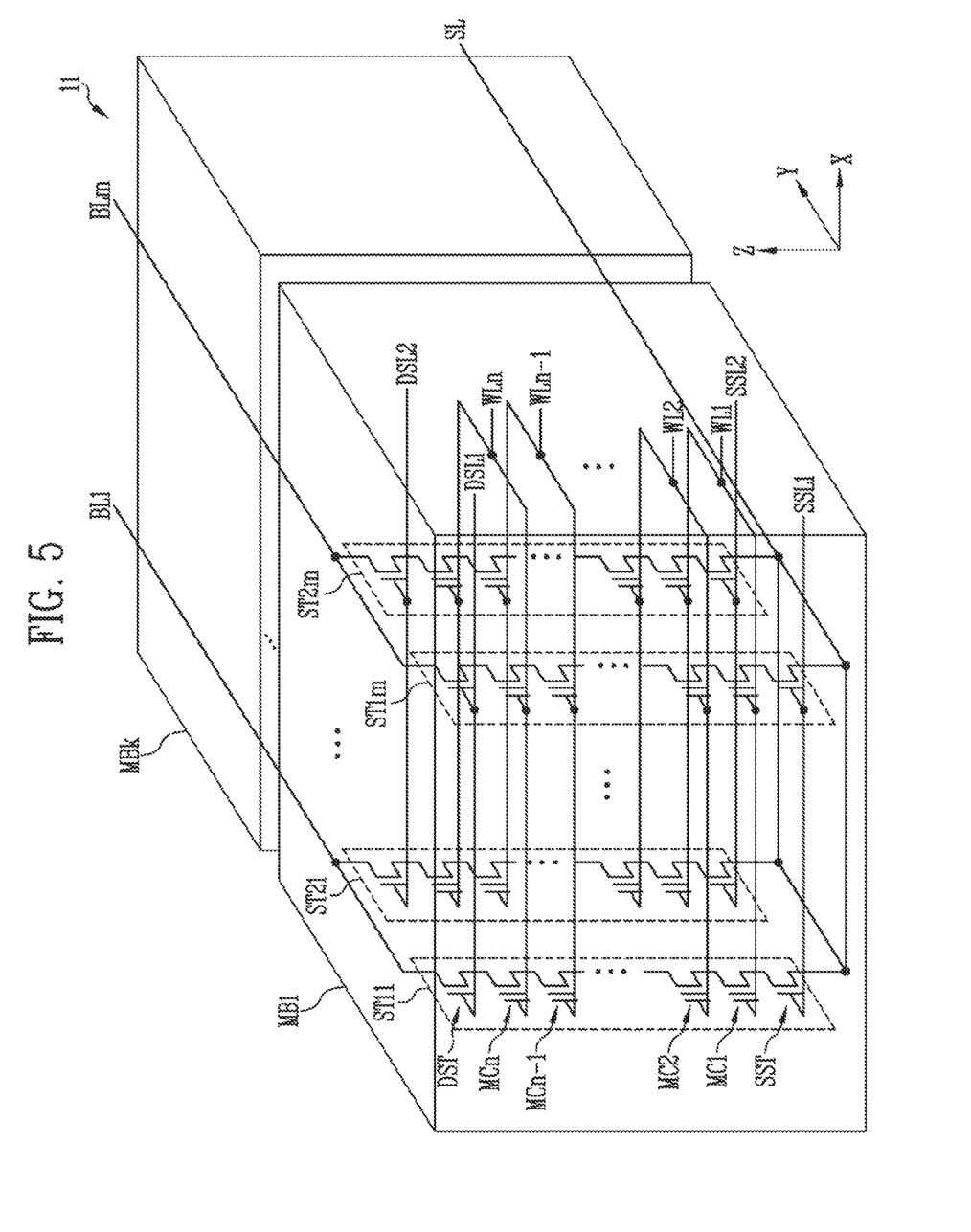
FIG. 5 is a diagram, illustrating an example of a memory block having a 3D structure.

FIG. 5 is a diagram, illustrating an example of a memory block having a 3D structure.

Referring to FIG. 5, the memory cell array 10 may include a plurality of memory blocks MB1 to MBk 11. Each memory block 11 may include a plurality of strings ST11 to ST1m and ST21 to ST2m. Each of the strings ST11 to ST1m and ST21 to ST2m may extend along a vertical direction (e.g., z direction). In the memory block 11, m strings may be arranged in a row direction (e.g., X direction). Although, in FIG. 5, two strings are illustrated as being arranged in a column direction (e.g., Y direction), this embodiment is given for convenience of description, and three or more strings may be arranged in the column direction (e.g., Y direction) in other embodiments.

Each of the strings ST11 to ST1m and ST21 to ST2m may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings that are arranged in the same row may be coupled to the same source select line. The source select transistors of the strings ST11 to ST1m that are arranged in a first row may be coupled to a first source select line SSL1. The source select transistors of the strings ST21 to ST2m that are arranged in a second row may be coupled to a second source select line SSL2. In other embodiments, the source select transistors of the strings ST11 to ST1m and ST21 to ST2m may be coupled in common to a single source select line.

In each string, the first to n-th memory cells MC1 to MCn may be coupled, in series, between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Accordingly, the reliability of data that is stored in the memory block 11 may be improved.

The drain select transistor DST of each string may be coupled between the corresponding bit line and the memory cells MC1 to MCn. The drain select transistors DST of strings that are arranged in the row direction may be coupled to a drain select line that extends along the row direction. The drain select transistors DST of the strings ST11 to ST1m in the first row may be coupled to a first drain select line DSL1. The drain select transistors DST of the strings ST21 to ST2m in the second row may be coupled to a second drain select line DSL2.

Figure 6:
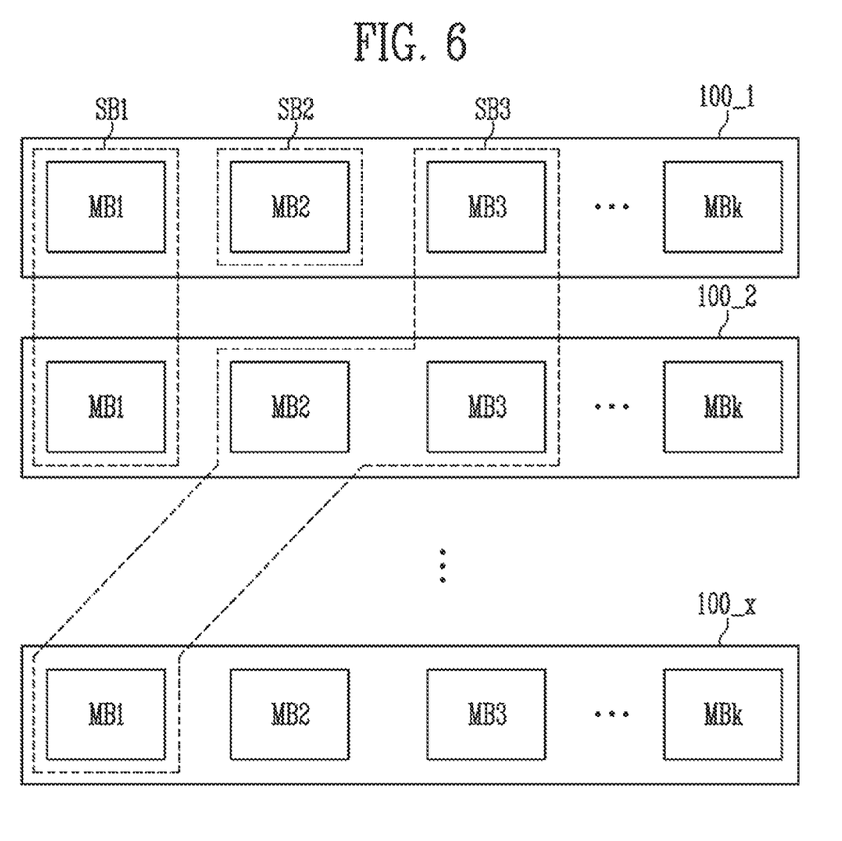
FIG. 6 is a configuration diagram, explaining a super block.

FIG. 6 is a configuration diagram, explaining a super block.

Referring to FIG. 6, each of a plurality of semiconductor memories 100_1 to 100_x may include a plurality of memory blocks MB1 to MBk. Each of a plurality of super blocks SB1 to SB3 may include at least one of the plurality of memory blocks MB1 to MBk that are included in each of the plurality of semiconductor memories 100_1 to 100_x. For example, the first super block SB1 may include a first memory block MB1 of the first semiconductor memory 1001 and a first memory block MB1 of the second semiconductor memory 100_2. Also, the second super block SB2 may include a second memory block MB2 of the first semiconductor memory 100_1.

Among the memory blocks that are not included in the super blocks, free blocks in an erased state may be configured to be included in a new super block when the new super block is configured or may be newly added and assigned to an existing super block when an additional free block is required in the existing super block.

Figure 7:
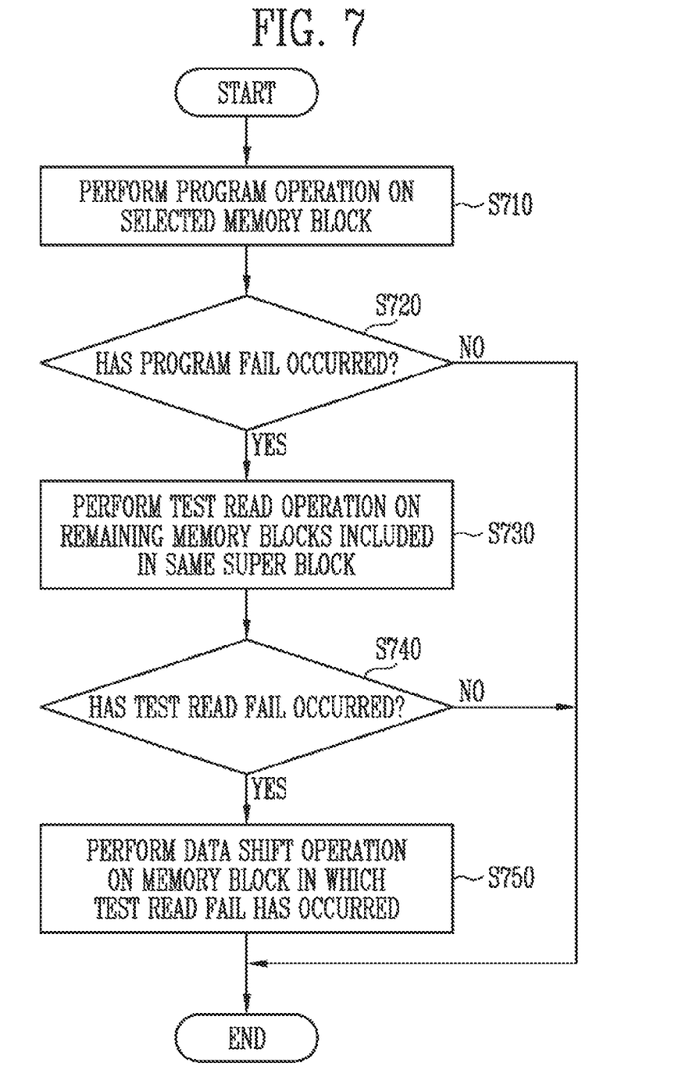
FIG. 7 is a flowchart, illustrating a method of operating a memory system, according to an embodiment of the present disclosure.

FIG. 7 is a flowchart, illustrating a method of operating a memory system, according to an embodiment of the present disclosure.

The method of operating the memory system, according to the embodiment of the present disclosure, will be described below with reference to FIGS. 1 to 7.

A case in which a program operation is performed on one (e.g., MB3 of 100_1) of memory blocks included in the super block SB3, among the super blocks of the memory device 1100, will be described by way of an example below.

When a host command that corresponds to a write operation and data to be programmed are received from the host 1400, the controller 1200 may control the memory device 1100 so that a write operation is performed on a memory block that is selected from among a plurality of memory blocks within the memory device 1100. For example, the controller 1200 may generate a command queue by queuing the host command, generate a command CMD depending on the command queue, and transmit the command CMD to the semiconductor memory 100_1 within the selected memory block (e.g., MB3 of 100_1). At this time, the data to be programmed DATA may be transmitted together with the command CMD. The semiconductor memory 100_1 may perform a program operation on the selected memory block MB3 on a page basis based on the received command CMD at step S710.

During the program operation that is performed on a page basis, whether a fail has occurred in the program operation on the selected page may be determined at step S720. For example, when the program operation on the selected page has not been completed even after all set program pulses are performed on the selected page, which is applied during an incremental step pulse programming (ISPP)-type program operation, it may be determined that a program fail has occurred.

At step S720, when it is determined that a program fail has not occurred in the pages that are included in the selected memory block (e.g., MB3 of 1001, in the case of No at step S720), the program operation may be terminated.

At step S720, when it is determined that a program fail has occurred in the selected page of the selected memory block (e.g., MB3 of 1001, in the case of Yes at step S720), it may be determined that the selected memory block (e.g., MB3 of 100_1) is a bad block, after which an additional memory block in an erased state is newly selected and the program operation is re-performed on the additional memory block. The additional memory block in an erased state, which is newly selected, may be managed such that it is included in the super block SB3 by the super block manager 1222 of the controller 1200.

The flash translation layer (FTL) 1221 of the controller 1200 may control the memory device 1100 so that a test read operation is performed on the remaining memory blocks (e.g., MB2 and MB3 of 100_2 and MB1 of 100_x) that are included in the super block SB3, including the memory block (e.g., MB3 of 100_1) in which the program fail has occurred. The memory device 1100 may perform the test read operation on the remaining memory blocks (e.g., MB2 and MB3 of 100_2 and MB1 of 100_x) included in the super block SB3 based on the controller 1200 at step S730. The test read operation may be performed on all pages of the remaining memory blocks (e.g., MB2 and MB3 of 100_2 and MB1 of 100_x) or may be performed on the same page as that of the memory block (e.g., MB3 of 100_1) in which the program fail has occurred.

The data that is read during the test read operation may be transmitted to the error correction circuit 1240 of the controller 1200, and the data may be used to determine the result of the test read operation at step S740. For example, the error correction circuit 1240 may determine the result of the test read operation based on pieces of data that are read during the test read operation. For example, when the number of error bits that are contained in the read data is greater than the maximum allowable number of error bits, the error correction circuit 1240 may determine that the result of the test read operation is a fail. On the other hand, when the number of error bits is less than or equal to the maximum allowable number of error bits, the error correction circuit 1240 may determine that the result of the test read operation is a pass.

At step S740, when it is determined that a read fail has not occurred in the remaining memory blocks (e.g., MB2 and MB3 of 100_2 and MB1 of 100_x) (in case of No), the program operation is terminated.

At step S740, when it is determined that a read fail has occurred in at least one of the remaining memory blocks (e.g., MB2 and MB3 of 100_2 and MB1 of 100_x, in the case of Yes at step S720), the FTL 1221 of the controller 1200 may control the memory device 1100 so that a data shift operation is performed on the memory block in which the test read fail has occurred at step S750. The memory device 1100 may read valid data that is stored in the memory block in which the test read fail has occurred and may transmit the valid data to the controller 1200 during the data shift operation. After temporarily storing the received data in the memory buffer 1230, the controller 1200 may select a new memory block in which the data is to be newly stored and may transmit the data to be programmed to a semiconductor memory with the selected memory block. The semiconductor memory with the selected memory block may receive the data to be programmed and may program the received data to the selected memory block. The super block manager 1222 of the controller 1200 may manage the super block so that the selected memory block is included in the super block SB3.

As described above, in an embodiment of the present disclosure, when a fail occurs during a program operation performed on a selected memory block, a test read operation is performed on the remaining memory blocks within the same super block as that of the selected memory block, so that memory blocks in which a latent error may occur may be detected, and valid data that is stored in the detected memory blocks may be shifted to and stored in additional memory blocks. Through this operation, memory blocks in which a latent error may occur may be detected in advance.

In the above-described embodiment of the present disclosure, the program operation that is performed on the selected memory block has been described by way of example. However, the same scheme as the program operation may also be applied to a read operation that is performed on a selected memory block. For example, when a read fail occurs during the read operation that is performed on the selected memory block, a test read operation is performed on the remaining memory blocks included in the same super block as that of the selected memory block, so that memory blocks in which a latent error may occur may be detected, and valid data stored in the detected memory blocks may be shifted to and stored in additional memory blocks.

Figure 8:
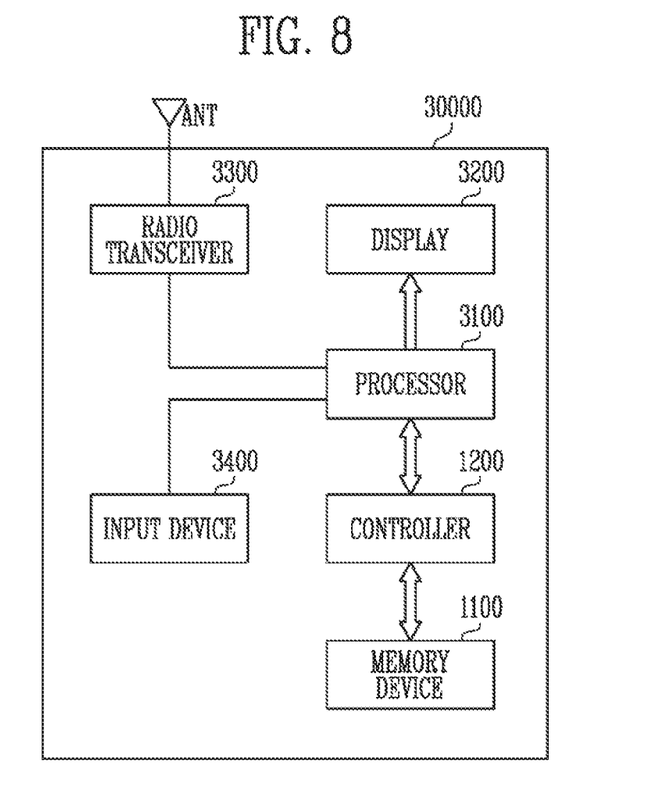
FIG. 8 is a diagram, illustrating an embodiment of a memory system.

FIG. 8 is a diagram, illustrating an embodiment of a memory system.

Referring to FIG. 8, a memory system 30000 may be implemented in a cellular phone, a smartphone, a tablet PC, a personal digital assistant (PDA) or a wireless communication device. The memory system 30000 may include a memory device 1100 and a controller 1200 which is capable of controlling the operation of the memory device 1100. The controller 1200 may control a data access operation for the memory device 1100, for example, a program operation, an erase operation or a read operation, based on a processor 3100.

Data programmed to the memory device 1100 may be output via a display 3200 based on the controller 1200.

The memory device 1100 may be configured to include at least one super block, as illustrated in FIG. 6.

A radio transceiver 3300 may exchange radio signals through an antenna ANT. For example, the radio transceiver 3300 may convert radio signals received through the antenna ANT into signals that may be processed by the processor 3100. Therefore, the processor 3100 may process the signals that are output from the radio transceiver 3300, and may transmit the processed signals to the controller 1200 or the display 3200. The controller 1200 may transmit the signals that are processed by the processor 3100 to the memory device 1100. Further, the radio transceiver 3300 may convert the signals that are output from the processor 3100 into radio signals, and output the radio signals to an external device through the antenna ANT. An input device 3400 may be used to input a control signal for controlling the operation of the processor 3100 or data to be processed by the processor 3100. The input device 3400 may be implemented as a pointing device, such as a touch pad or a computer mouse, a keypad or a keyboard. The processor 3100 may control the operation of the display 3200 so that the data that is output from the controller 1200, the data that is output from the radio transceiver 3300, or the data that is output from the input device 3400 is output via the display 3200.

In an embodiment, the controller 1200 that is capable of controlling the operation of the memory device 1100 may be implemented as a part of the processor 3100 or as a chip that is provided separately from the processor 3100. Further, the controller 1200 may be implemented through the example of the controller illustrated in FIG. 2.

Figure 9:
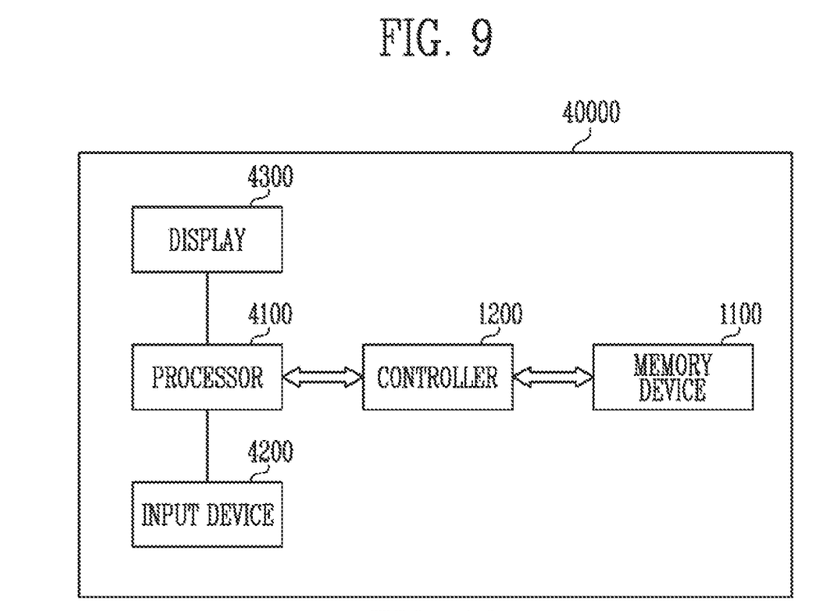
FIG. 9 is a diagram, illustrating an embodiment of a memory system.

FIG. 9 is a diagram, illustrating an embodiment of a memory system.

Referring to FIG. 9, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include a memory device 1100 that stores data, and a controller 1200 that is capable of controlling a data processing operation for the memory device 1100.

The memory device 1100 may be configured to include at least one super block, as illustrated in FIG. 6.

A processor 4100 may output data that is stored in the memory device 1100 via a display 4300 based on the data that is input through an input device 4200. For example, the input device 4200 may be implemented as a pointing device, such as a touch pad or a computer mouse, a keypad or a keyboard.

The processor 4100 may control the overall operation of the memory system 40000 and may control the operation of the controller 1200. In an embodiment, the controller 1200 that is capable of controlling the operation of the memory device 1100 may be implemented as a part of the processor 4100 or as a chip that is provided separately from the processor 4100. Further, the controller 1200 may be implemented through the example of the controller illustrated in FIG. 2.

Figure 10:
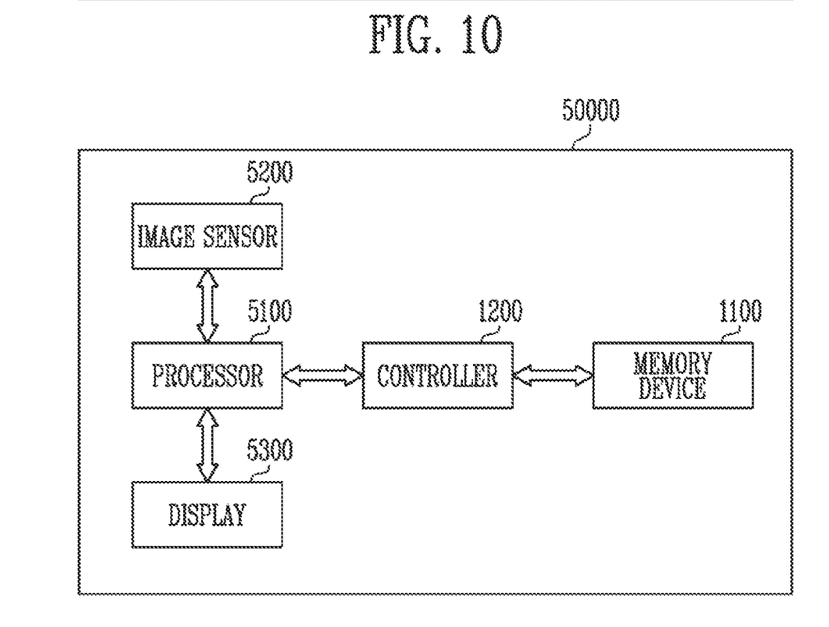
FIG. 10 is a diagram, illustrating an embodiment of a memory system.

FIG. 10 is a diagram, illustrating an embodiment of a memory system.

Referring to FIG. 10, a memory system 50000 may be implemented in an image processing device, for example, a digital camera, a mobile phone provided with a digital camera, a smartphone provided with a digital camera, or a tablet PC provided with a digital camera.

The memory system 50000 may include a memory device 1100 and a controller 1200 that is capable of controlling a data processing operation for the memory device 1100, for example, a program operation, an erase operation or a read operation.

An image sensor 5200 of the memory system 50000 may convert an optical image into digital signals, and the converted digital signals may be transmitted to a processor 5100 or the controller 1200. Based on the processor 5100, the converted digital signals may be output via a display 5300 or may be stored in the memory device 1100 through the controller 1200. Further, data that is stored in the memory device 1100 may be output via the display 5300 based on the processor 5100 or the controller 1200.

The memory device 1100 may be configured to include at least one super block, as illustrated in FIG. 6.

In an embodiment, the controller 1200 that is capable of controlling the operation of the memory device 1100 may be implemented as a part of the processor 5100 or as a chip that is provided separately from the processor 5100. Further, the controller 1200 may be implemented through the example of the controller as illustrated in FIG. 2.

Figure 11:
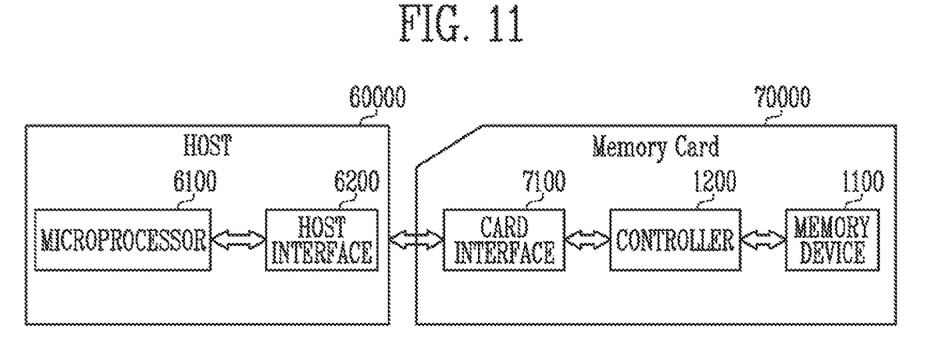
FIG. 11 is a diagram, illustrating an embodiment of a memory system.

FIG. 11 is a diagram, illustrating an embodiment of a memory system.

Referring to FIG. 11, a memory system 70000 may be implemented as a memory card or a smart card. The memory system 70000 may include a memory device 1100, a controller 1200, and a card interface 7100.

The memory device 1100 may be configured to include at least one super block, as illustrated in FIG. 6.

The controller 1200 may control data exchange between the memory device 1100 and the card interface 7100. In an embodiment, the card interface 7100 may be, but is not limited to, a secure digital (SD) card interface or a multimedia card (MMC) interface. Further, the controller 1200 may be implemented through the example of the controller as illustrated in FIG. 2.

The card interface 7100 may facilitate the data exchange between a host 60000 and the controller 1200 based on a protocol of the host 60000. In an embodiment, the card interface 7100 may support a universal serial bus (USB) protocol and an interchip (IC)-USB protocol. Here, the card interface 7100 may refer to hardware that is capable of supporting a protocol that is used by the host 60000, software that is installed in the hardware, or a signal transmission method that is performed by the hardware.

When the memory system 70000 is coupled to a host interface 6200 of the host 60000, such as a PC, a tablet PC, a digital camera, a digital audio player, a mobile phone, console video game hardware, or a digital set-top box, the host interface 6200 may perform data communication with the memory device 1100 through the card interface 7100 and the controller 1200 based on a microprocessor 6100.

The present disclosure may suppress the possibility of error occurrence by performing a test read operation on the remaining memory blocks included in a super block of a memory device when a fail occurs in a certain memory block included in the super block.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory system, comprising:
   a memory device including super blocks, each of the super blocks including a plurality of memory blocks; and
   a controller configured to control the memory device so that a program operation is performed on a selected memory block within any one of the super blocks based on a request from a host,
   wherein, when a program fail occurs during the program operation that is performed on the selected memory block of the selected super block, the controller is configured to control the memory device so that a test read operation is performed on remaining memory blocks, besides the selected memory block, of the selected super block.

2. The memory system according to claim 1, wherein, when the program fail occurs in the selected memory block, the memory device is configured to select a new memory block in an erased state from among the plurality of memory blocks of the selected super block and perform the program operation on the new memory block.

3. The memory system according to claim 1, wherein the memory device performs the test read operation on a page within one of the remaining memory blocks of the selected super block, and
   wherein the page on which the test read operation is performed is identical to a page in which the program fail has occurred in the selected memory block of the selected super block.

4. The memory system according to claim 1, wherein the memory device performs the test read operation on all pages of the remaining memory blocks during the test read operation.

5. The memory system according to claim 1, wherein the controller controls the memory device so that a data shift operation is performed on a memory block in which a fail has occurred as a result of the test read operation.

6. The memory system according to claim 5, wherein the data shift operation is configured to read valid data that is stored in the memory block in which the fail has occurred and configured to store the valid data in a new memory block, among the remaining memory blocks, in an erased state.

7. The memory system according to claim 6, wherein the controller manages the super block so that the new memory block is included in the selected super block, which includes the selected memory block in which the fail has occurred.

8. A memory system, comprising:
   a memory device including a plurality of memory blocks; and
   a controller configured to control the memory device so that a program operation is performed on a first memory block, among the plurality of memory blocks, based on a request from a host, wherein, when a program fail occurs during the program operation that is performed on the first memory block, the controller is configured to control the memory device so that a test read operation is performed on second memory blocks in a same super block as the first memory block and configured to control the memory device so that a data shift operation is performed on the second memory blocks based on a result of the test read operation.

9. The memory system according to claim 8, wherein the controller comprises:
   a processor configured to manage the super block and to control the memory device so that the test read operation is performed; and
   an error correction circuit configured to determine the result of the test read operation.

10. The memory system according to claim 9, wherein:
    the processor controls the memory device so that the data shift operation is performed on third memory blocks, among the second memory blocks, in which a fail has occurred as the result of the test read operation, and
    the data shift operation is configured to shift valid data that is stored in the third memory blocks to fourth memory blocks, among the plurality of memory blocks, in an erased state and to store the valid data in the fourth memory blocks.

11. The memory system according to claim 10, wherein the processor manages the super block so that the fourth memory blocks for which the data shift operation has been completed are included in the same super block as the first memory block and the second memory block.

12. The memory system according to claim 8, wherein the memory device performs the test read operation on a page within the second memory blocks of the super block, and
    wherein the page on which the test read operation is performed is identical to a page in which the program fail has occurred in the first memory block of the super block.

13. The memory system according to claim 8, wherein the memory device performs the test read operation on all pages of the second memory blocks during the test read operation.

14. A method of operating a memory system, comprising:
    performing a program operation on a memory block that is selected from among a plurality of memory blocks;
    when a program fail occurs in the selected memory block, performing a test read operation on remaining memory blocks, besides the selected memory block, included in a same super block as the selected memory block; and
    performing a data shift operation on memory blocks, among the remaining memory blocks, in which a read fail has occurred as a result of the test read operation.

15. The method according to claim 14, further comprising:
    when the program fail occurs in the selected memory block, determining that the selected memory block is a bad block, selecting a new memory block, among the plurality of memory blocks, in an erased state, and re-performing the program operation on the new memory block.

16. The method according to claim 14, wherein the test read operation is performed on a page within one of the remaining memory blocks of the super block, and
    wherein the page on which the test read operation is performed is identical to a page in which the program fail has occurred in the selected memory block of the super block.

17. The method according to claim 14, wherein the test read operation is performed on all pages of the remaining memory blocks during the test read operation.

18. The method according to claim 14, wherein the data shift operation is configured to read valid data that is stored in the memory blocks in which the read fail has occurred and configured to store the valid data in new memory blocks, among the plurality of memory blocks, in an erased state.

19. The method according to claim 18, wherein the super block is managed such that the new memory blocks in the erased state are included in the super block.

20. The method according to claim 14, wherein the plurality of memory blocks are managed to be grouped into a plurality of super blocks.

* * * * *